(12) United States Patent
Hilton et al.

(10) Patent No.: US 7,904,786 A0
(45) Date of Patent: Mar. 8, 2011

(54) ASSISTED MEMORY SYSTEM

(75) Inventors: Richard L. Hilton, Boise, ID (US);
Kenneth J. Eldredge, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2260 days.

(21) Appl. No.: 10/384,053

(22) Filed: Mar. 6, 2003

(65) Prior Publication Data
US 2004/0181733 A1   Sep. 16, 2004

(51) Int. Cl.
*H03M 13/00* (2006.01)

(52) U.S. Cl. .......................................... 714/758; 714/718

(58) Field of Classification Search ................... 714/752, 714/765, 763, 43, 718, 758; 365/200
See application file for complete search history.

(56) References Cited

U.S. PATENT DOCUMENTS

| | | | | |
|---|---|---|---|---|
| 5,394,407 A * | 2/1995 | Coddington | ................... | 714/752 |
| 5,901,159 A * | 5/1999 | Ichikawa | ...................... | 714/765 |
| 5,912,906 A * | 6/1999 | Wu et al. | ........................ | 714/763 |
| 6,212,647 B1 | 4/2001 | Sims, III et al. | | |
| 6,272,651 B1 * | 8/2001 | Chin et al. | ....................... | 714/43 |
| 6,426,893 B1 | 7/2002 | Conley et al. | | |
| 6,442,676 B1 | 8/2002 | Guenthner | | |
| 6,445,612 B1 | 9/2002 | Naji | | |
| 6,445,613 B1 | 9/2002 | Nagai | | |
| 6,446,184 B2 | 9/2002 | Dell et al. | | |
| 6,510,537 B1 * | 1/2003 | Lee | ............... | 714/763 |
| 6,643,195 B2 * | 11/2003 | Eldredge et al. | ............. | 365/200 |
| 2001/0035545 A1 | 11/2001 | Schuster-Woldan et al. | | |
| 2002/0078415 A1 | 6/2002 | Taira et al. | | |
| 2002/0083390 A1 | 6/2002 | Lee et al. | | |
| 2002/0097604 A1 | 7/2002 | Katayama et al. | | |
| 2002/0097613 A1 | 7/2002 | Raynham | | |
| 2002/0120890 A1 | 8/2002 | Calvignac et al. | | |
| 2002/0120901 A1 | 8/2002 | Poirier et al. | | |

OTHER PUBLICATIONS

World Wide Web, http://www.eetimes,com/printableArticle?doc_id= OEG20020708S0017, David Lammers, "The Promise of MRAM," CMP Media, LLC, Jul. 8, 2002, 2 pages.
World Wide Web, http://www.brouhaha.com/ eric/computers/ecc.html, Eric Smith, "Memory Error Detection and Correction," printed on Mar. 6, 2003, 3 pages.
Boris Polianskikh, et al., "Design and Implementation of Error Detection and Correction Circuitry for Multilevel Memory Protecction," Institute of Electrical and Electronic Engineers, 2002, pp. 89-95.
World Wide Web, http://www.goldenram.com/support/ecc.asp, "Introduction to ECC," Goldenram Memory, printed on Mar. 6, 2003, 3 pages.
World Wide Web, http:/www.pcguide/ref/ram/errECC-c.html, Charles M. Kozlerok, "ECC," The PC Guide, Site Version 2.2.0, Apr. 17, 2001, 2 pages.
World Wide Web, http://www.pcguide.com/ref/hdd/geom/errECC-c.html, Charles M. Kozierok, "Error Correcting Code (ECC)," The PC Guide, Site Version 2.2.0, Apr. 17, 2001, 2 pages.

* cited by examiner

*Primary Examiner* — David Ton

(57) ABSTRACT

A memory system comprises a plurality of memory storage elements, an address sparing module coupled to the plurality of memory storage elements and operable to map first addresses of first predetermined memory locations to second addresses of second predetermined memory locations, and an ECC (error correcting cod) combinatorial logic circuit coupled to the plurality of memory storage elements and operable to detect and correct errors in data read from the plurality of memory storage elements in less than three clock cycles.

25 Claims, 2 Drawing Sheets

ASSISTED MEMORY SYSTEM

TECHNICAL FIELD OF THE INVENTION

The invention relates to random access memory for data storage. More specifically, this invention relates to an assisted memory system.

BACKGROUND OF THE INVENTION

Great strides have been made in memory technology to increase speed, have higher capacity and be more fault-tolerant. Speed and higher capacity in memory devices is achieved primarily by making the memory elements or cells smaller and more densely packed. Because memory element size is also proportional to cost per bit, the goal of memory manufacturers is to push the memory element size down as much as practicable. By reducing the cell size, these memory devices become competitive in cost and capacity for use as embedded memory in consumer electronic products and toys, as well as computers and other devices.

Shrinking the size of integrated circuits and memory devices is not a simple and straightforward task. The reduction in size and increase in density often introduces defects in the memory elements due to unperfected manufacturing processes and other failures. Some yield-reducing defects may include, for example, stuck-at faults, transition faults, coupling faults, and pattern-sensitive faults.

SUMMARY OF THE INVENTION

In accordance with an embodiment of the present invention, a memory system comprises a plurality of memory storage elements, an address sparing module coupled to the plurality of memory storage elements, and an ECC (error correcting code) combinatorial logic circuit coupled to the plurality of memory storage elements and operable to detect and correct errors in data read from the plurality of memory storage elements in less than three clock cycles.

In accordance to another embodiment of the present invention, a device comprises a processor, a plurality of memory storage elements operable to store data in response to instructions from the processor, an address sparing module coupled to the plurality of memory storage elements and the processor, and operable to map first addresses of first predetermined memory locations received from the processor to second addresses of second predetermined memory locations, and an ECC (error correcting code) combinatorial logic circuit coupled to the plurality of memory storage elements and the processor, and operable to detect and correct errors in data read from the plurality of memory storage elements prior to providing the data to the processor in less than three clock cycles.

In accordance with yet another embodiment of the present invention, a method comprises receiving data and at least one address to store the data in a plurality of random access memory storage elements, determining whether the received at least one address points to a defective memory location, mapping the received address to at least one corrected address in response to the at least one address points to a defective memory location, generating an ECC (error correcting code) codeword using an ECC combinatorial logic encoder from the received data in less than three clock cycles, and storing the ECC codeword to the plurality of random access memory storage elements, and reading the plurality of random access memory storage elements and decoding the ECC codewords therein using an ECC combinatorial logic decoder and operable to detect and correct errors therein.

In accordance with yet another embodiment of the present invention, a memory comprises a plurality of memory storage elements, an ECC (error correcting code) combinatorial logic encoder coupled to the plurality of memory storage elements, and operable to generate an ECC codeword based on data to be stored in the plurality of memory storage elements in less than three clock cycles. The memory further comprises an ECC combinatorial logic decoder coupled to the plurality of memory storage elements, and operable to receive an ECC codeword read from the plurality of memory storage elements, and decode the ECC codeword to correct at least one error in the data in less than three clock cycles.

In accordance with another embodiment of the present invention, an ECC (error correcting code) method comprises an encoding method completed in less than three clock cycles, the encoding method comprising receiving a data block of a predetermined number of bits, generating a plurality of ECC bits based on the data block using combinatorial logic, and appending the plurality of ECC bits to the data block and generating an ECC codeword therefrom. The ECC method further comprises a decoding method completed in less than three clock cycles, the decoding method comprising: receiving an ECC codeword, and decoding the ECC codeword and correcting errors, if any, using combinatorial logic and generating the data block of a predetermined number of bits.

BRIEF DESCRIPTION OF THE DRAWINGS

For a more complete understanding of the present invention, the objects and advantages thereof, reference is now made to the following descriptions taken in connection with the accompanying drawings in which.

DETAILED DESCRIPTION OF THE DRAWINGS

The preferred embodiment of the present invention and its advantages are best understood by referring to FIGS. 1 through 5 of the drawings, like numerals being used for like and corresponding parts of the various drawings.

Figure 1:
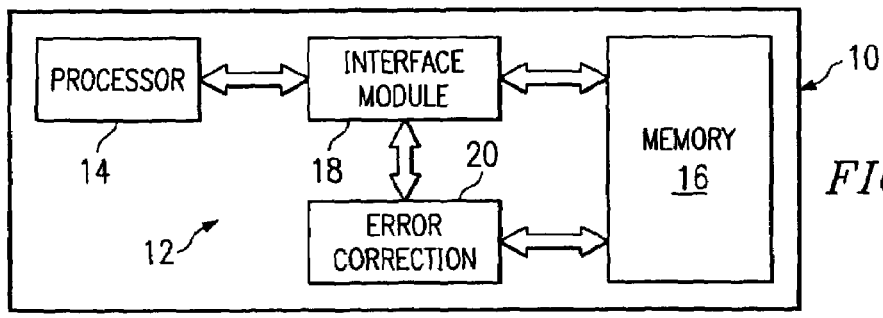
FIG. 1 is a simplified block diagram of a device 10 having an assisted memory system 12 according to an embodiment of the present invention.

FIG. 1 is a simplified block diagram of a device 10 having an assisted memory system 12 according to an embodiment of the present invention. Device 10 may be any articles of manufacture that comprises a processor 14 for controlling one or more aspects of its function. For example, device 10 may be a computer in any of its incarnations, any device that captures, processes, displays and/or transmits audio, video, and other types of multimedia data, telecommunication devices, personal digital assistants, etc. Assisted memory system 12 is communicatively coupled to processor 14, and comprises a memory 16 and an interface module 18. Memory 16 comprises a plurality of memory cells or memory elements each of which is capable of storing at least one bit of data. Memory 16 may comprise one or a plurality of memory chips. Memory 16 may be of any memory technology, such as any random access memory (RAM), including dynamic RAM (DRAM), extended data out RAM (EDO RAM), video RAM (VRAM), static RAM (SRAM), synchronous DRAM (SDRAM), and magnetoresistive or magnetic RAM (MRAM). MRAMs are of special interest as the next disruptive nonvolatile memory technology to replace flash memory and EEPROM where fast writing or high write endurance is required, and in the longer term as a general purpose read/write RAM. As manufacturers are perfecting MRAM designs and fabrication processes to shrink the size and reduce the error rates and defects, it is important to provide an assisted memory system that enables imperfect memory to function virtually as perfect or near-perfect devices. Although the present invention is described herein primarily in the context of MRAM, the invention is not so limited and is applicable to other memory storage technologies.

Hewlett-Packard Company, the assignee of the present invention, is also the assignee of several other patents related to MRAM technology, including: U.S. Pat. No. 6,188,615, entitled MRAM DEVICE INCLUDING DIGITAL SENSE AMPLIFIERS, filed Oct. 29, 1999, and issued Feb. 13, 2001; U.S. Pat. No. 6,163,477, entitled MRAM DEVICE USING MAGNETIC FIELD BIAS TO IMPROVE REPRODUCIBILITY OF MEMORY CELL SWITCHING, filed Aug. 6, 1999, and issued Dec. 19, 2000; U.S. Pat. No. 6,128,239, entitled MRAM DEVICE INCLUDING ANALOG SENSE AMPLIFIERS, filed Oct. 29, 1999, and issued Oct. 3, 2000; U.S. Pat. No. 6,111,783, entitled MRAM DEVICE INCLUDING WRITE CIRCUIT FOR SUPPLYING WORD AND BIT LINE CURRENT HAVING UNEQUAL MAGNITUDES, filed Jun. 16, 1999, and issued Aug. 29, 2000; and U.S. Pat. No. 5,982,660, entitled MAGNETIC MEMORY CELL WITH OFF-AXIS REFERENCE LAYER ORIENTATION FOR IMPROVED RESPONSE, filed Aug. 27, 1998, and issued Nov. 9, 1999. These patents are hereby incorporated by reference herein.

Interface module 18 serves as an interface between processor 14 and memory 16. For a device 10 such as a notebook computer or personal computer, interface module 18 may comprise an EIDE (enhanced integrated drive electronics) ESDI (enhanced small device interface), SCSI (small computer system interface) or another suitable interface. For a server, interface module 18 may comprise a fiber channel or SCSI interface. For a device 10 such as a digital camera, interface module 18 may comprise a camera interface and memory 16 may be used for short or long-term storage of digital images on-board the digital camera. In other computer systems, interface module 18 may be a memory controller bus that enables processor 14 to read and write to memory 16. The implementation of interface module 18 will depend on the functionality of processor 14 and device 10 to enable processor 14 to effectively communicate with memory 16, and to read and write data.

Assisted memory system 12 further comprises an error correction module 20 that is operable to detect and correct temporary and permanent errors arising in memory 16. Examples of error detection and correction include address sparing schemes and error correcting code (ECC) schemes. ECC is a technique that is used to compute a code based on the data written to memory, which is then used to check the accuracy of the data when it is read from memory. ECC is a form of parity detection but involves complex computations to determine the ECC code. With the aid of error correction module 20, assisted memory system 12 is able to employ an imperfect memory technology in memory 16 with a higher tolerable degree of defects. In order to take advantage of new memory technology, assisted memory system 12 employs error correction module 20 to recognize and correct errors that may arise in memory 16.

Figure 2:
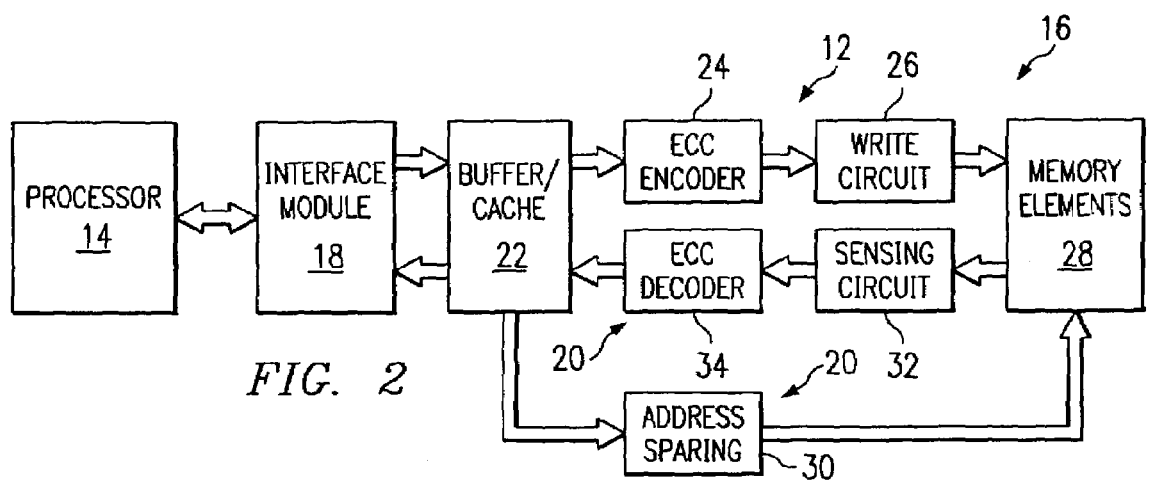
FIG. 2 is a simplified block diagram of an embodiment of assisted memory system 12 according to the present invention.

FIG. 2 is a more detailed block diagram of an embodiment of assisted memory system 12 according to the present invention. Coupled to interface module 18 is a secondary data storage module or a buffer/cache 22 operable to temporarily store read/write data. Buffer/cache 22 is operable to store the current data block for fast access by processor 14. Preferably, buffer/cache 22 functions as a cache to store more than one block of data, either most-recently-accessed or anticipated-to-be-accessed, in anticipation of processor demands. In its simplest form, buffer/cache 22 may store the current active data block while loading the next block of data in the address space in anticipation of sequential access by processor 14.

Figure 4:
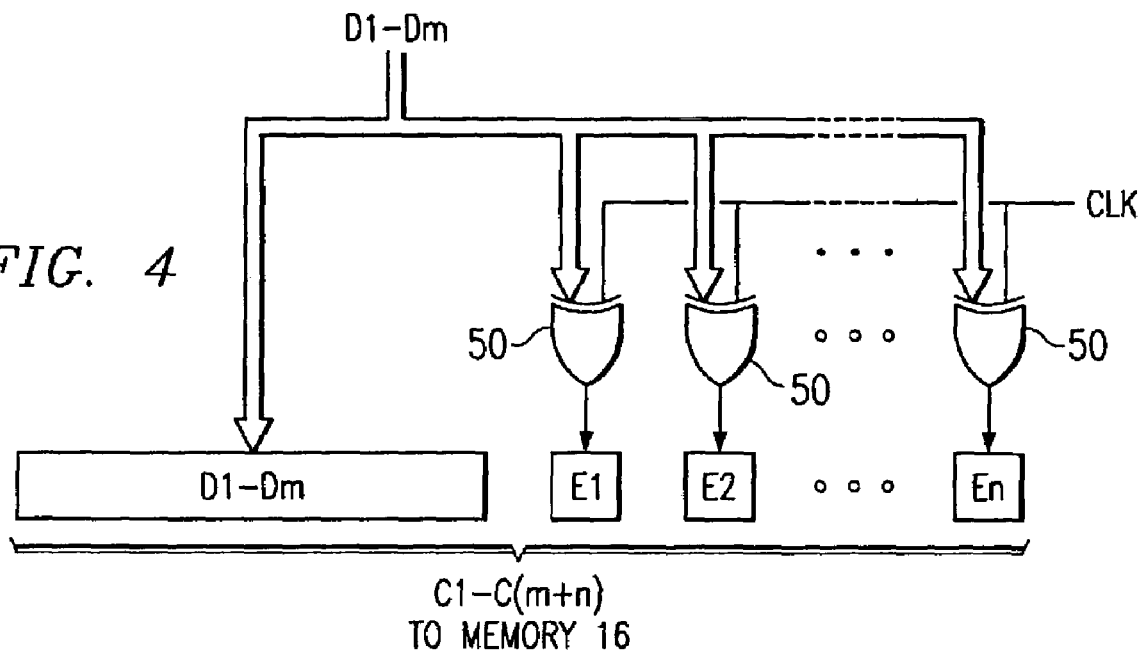
FIG. 4 is a logic diagram of an embodiment of an ECC encoder according to the present invention.

Write data is communicated to an ECC encoder 24 coupled to buffer/cache 22, which generates a plurality of ECC bits to be appended to the data bits. Details of ECC encoder 24 are shown in FIG. 4 and are described in detail below. A write circuit 26 coupled between ECC encoder 24 and memory elements 28 functions to write the data and ECC bits to memory locations specified by the write address. Write circuit 26 may comprise write word lines and other circuit elements and configurations (not shown) that depend on the memory technology used to implement memory elements 28. The write address may be modified by an address sparing module 30, which operates to map the logical address of a block of defective memory cells to a physical address of another block of memory cells where the data actually reside. In other embodiments, all memory addresses may be mapped to new addresses as to in effect shift all addresses by the number of defective memory locations. Details of embodiments of the address sparing technology are provided in commonly-assigned U.S. patent application Ser. No. 10/044,542, filed on Jan. 11, 2002, and entitled Self-Healing MRAM, and U.S. patent application Ser. No. 09/766,354, filed on Jan. 19, 2001, and entitled Self-Healing Memory, both incorporated herein by reference. ECC scheme is optimally used for detecting and correcting, on-the-fly, the occurrence of a few data error bits, and address sparing is optimally used for correcting permanent errors or defects in larger chucks of the memory. It is preferable to combine both of these schemes and perhaps other suitable techniques to mask temporary and permanent errors in memory devices.

A sensing circuit 32 is coupled to memory elements 28 to sense the logical state thereof and thereby obtain stored data to provide to processor 14. Sensing circuit 32 reads the stored data and provides the data to an ECC decoder 34. ECC decoder 34 is operable to detect an error, if it exists, and to provide the corrected data to buffer/cache 22. Details of ECC decoder 34 are set forth below with reference to FIG. 5.

In assisted memory system 12, the data is written and read in a number of bits that are potentially larger than the memory bus width between processor 14 and host interface module 18. This enables efficient ECC protection and improved performance for sequential accesses by reading multiple bits in parallel. Address sparing module 30 translates the processor-requested memory address to an internal physical memory address according to a defect table containing known defect information and address mapping information. ECC encoding and decoding adds additional data error correction on-the-fly. ECC encoder 24 and ECC decoder 34 are preferably implemented by very "flat", and thus fast, combinatorial logic that complete encoding and decoding operations in less than three clock cycles, preferably one clock cycle. This is in stark contrast with current conventional state machine implementations that require many clock cycles to perform long computations to generate the correct ECC codes and to decode the ECC codes.

Figure 3:
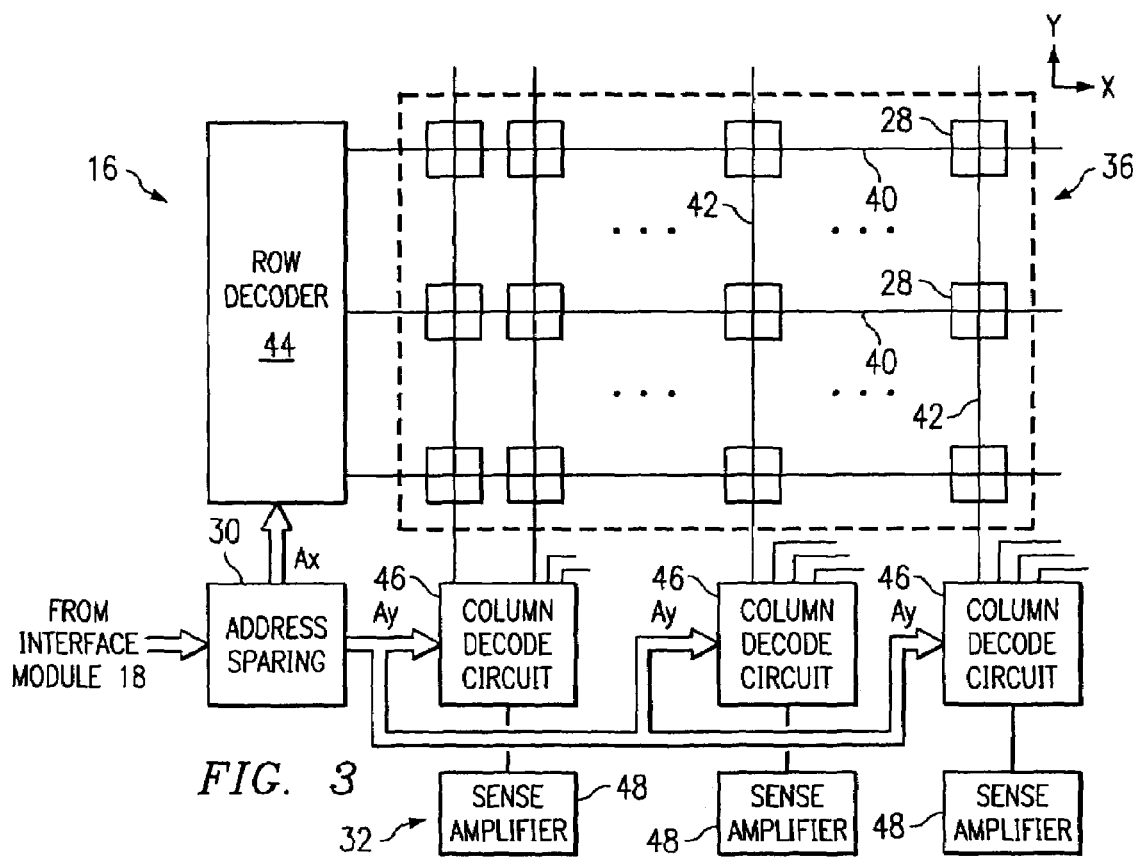
FIG. 3 is a more detailed block diagram of an embodiment of assisted memory system 12 according to the present invention.

FIG. 3 is a more detailed block diagram of an embodiment of assisted memory system 12 according to the present invention. Memory 16 comprises at least one memory device such as an MRAM with memory elements 28 arranged in an array 36. Each magnetic memory storage element 28 typically comprises a data storage layer and a reference layer. The logic state of a magnetic memory element depends on the relative orientations of magnetization in its data storage and reference layers. The magnetization of each memory element assumes one of two stable orientations at any given time. These two stable orientations, parallel and anti-parallel, represent logic values of "0" and "1". Memory elements 28 are typically arranged in rows and columns, with the rows extending along an x-direction and the columns extending along a y-direction. Only a relatively small number of memory elements are shown in FIG. 3 to greatly simplify the description of the invention. In practice, arrays of 1024×1024 memory elements or larger are commonly used in various industries.

Traces functioning as word lines 40 extend along the x-direction, and traces functioning as bit lines 42 extend along the y-direction. In one embodiment, there is one word line for each row of memory elements 28 and one bit line for each column of memory elements 28. Each memory element is shown located at a crossing point of a corresponding word line 40 and bit line 42. Sensing circuit 32 (FIG. 2) senses the resistance of selected memory elements 28 during read operations, and orients the magnetization of selected memory elements 28 during write operations.

Memory 16 comprises a row decoder 44 operable to select word lines 40 and a plurality of column decode circuits 46 (also referred to as column decoder 46) for selecting bit lines 42 during read and write operations. A memory cell 28 is selected by supplying a row address $A_x$ to row decoder 44 and a column address $A_y$ to column decoder 46. In response to the row address $A_x$, row decoder 44 couples a corresponding word line 40 to a known voltage level such as ground. In response to the column address $A_y$, column decoder 46 couples a corresponding bit line 42 to a sense amplifier 48. A selected memory element 28 lies at the cross point of selected word and bit lines 40 and 42. Sense amplifiers 48 sense the logic state of selected memory elements 28.

The row addresses $A_x$ and the column addresses $A_y$ may be supplied to row decoder 44 and column decoder 46, respectively, by address sparing circuit 30. In one embodiment, sparing circuit 30 receives a logical address from processor 14 through interface module 18, and converts the received logical address to a physical address based on stored memory cell defect information. Row decoder 44 and column decoder 46 may use the physical addresses provided by sparing circuit 30 to select corresponding memory elements 28.

ECC is a common parity scheme. The Hamming code, Reed-Solomon codes, binary Golay codes, binary Goppa code, Viterbi code or other algorithms may be used to generate the ECC bits based on a block of data of a predetermined size. Higher correction capability and data efficiency can be achieved with larger data block sizes, more powerful ECC algorithms, but greater circuit complexity. Rather than using complex state machines to implement the logic of ECC encoder 24 and ECC decoder 34 as in conventional systems, embodiments of the present invention use a "flat" combinatorial logic scheme. Such an ECC architecture can encode and decode the ECC data in one or very few clock cycles, for example less than three clock cycles. An embodiment of the present invention is described by using a four-bit data block example, which may be extrapolated to data blocks of larger sizes. In this example, the ECC codeword is the four-bit data with three bits of additional ECC bits appended thereto. Hamming code is used in this example to generate the ECC bits. The resulting relationship between the input data bits and the output ECC codeword can be summarized in table A.

TABLE A

| Data input | | | | Codeword Output | | | | | | |
|---|---|---|---|---|---|---|---|---|---|---|
| 0 | 0 | 0 | 0 | 0 | 0 | 0 | 0 | 0 | 0 | 0 |
| 0 | 0 | 0 | 1 | 0 | 0 | 0 | 1 | 0 | 1 | 1 |
| 0 | 0 | 1 | 0 | 0 | 0 | 1 | 0 | 1 | 1 | 0 |
| 0 | 0 | 1 | 1 | 0 | 0 | 1 | 1 | 1 | 0 | 1 |
| 0 | 1 | 0 | 0 | 0 | 1 | 0 | 0 | 1 | 1 | 1 |
| 0 | 1 | 0 | 1 | 0 | 1 | 0 | 1 | 1 | 0 | 0 |
| 0 | 1 | 1 | 0 | 0 | 1 | 1 | 0 | 0 | 0 | 1 |
| 0 | 1 | 1 | 1 | 0 | 1 | 1 | 1 | 0 | 1 | 0 |
| 1 | 0 | 0 | 0 | 1 | 0 | 0 | 0 | 1 | 0 | 1 |
| 1 | 0 | 0 | 1 | 1 | 0 | 0 | 1 | 1 | 1 | 0 |
| 1 | 0 | 1 | 0 | 1 | 0 | 1 | 0 | 0 | 1 | 1 |
| 1 | 0 | 1 | 1 | 1 | 0 | 1 | 1 | 0 | 0 | 0 |
| 1 | 1 | 0 | 0 | 1 | 1 | 0 | 0 | 0 | 1 | 0 |
| 1 | 1 | 0 | 1 | 1 | 1 | 0 | 1 | 0 | 0 | 1 |
| 1 | 1 | 1 | 0 | 1 | 1 | 1 | 0 | 1 | 0 | 0 |
| 1 | 1 | 1 | 1 | 1 | 1 | 1 | 1 | 1 | 1 | 1 |

If the four data bits in are $d_1$, $d_2$, $d_3$, and $d_4$, and the codeword output bits are $c_1$, $c_2$, $c_3$, $c_4$, $c_5$, $c_6$, and $c_7$, then the logical relationship between input and output in TABLE A can then be reduced to:

$c_1 = d_1$ $c_2 = d_2$ $c_3 = d_3$ $c_4 = d_4$ $c_5 = d_1$ XOR $d_2$ XOR $d_3$ $c_6 = d_2$ XOR $d_3$ XOR $d_4$ $c_7 = d_1$ XOR $d_2$ XOR $d_4$

These logic equations can be implemented by combinatorial logic for ECC encoder 24 that can compute the ECC code in less than three clock cycles, and preferably in one clock cycle. As shown in FIG. 4, selected data inputs, $d_1$ to $d_m$, are provided to a logic circuit 50 for each ECC bit, $e_1$ to $e_n$, which are appended to form codewords $c_1$ to $c_{(m+n)}$. The codewords are stored in memory 16. In FIG. 4, XOR gates are used to represent the logic circuit for generating the ECC bits. Preferably, the encoding is performed in one clock cycle of the clock signal, CLK. Because of the simplicity of the Hamming code in this example, the resultant logic equations can seem naturally suited to a combinatorial logic implementation. However, this Hamming code implementation is provided solely as an example to illustrate the process of determining the combinatorial logic circuit; more complex and powerful ECC codes such as Reed-Solomon would yield logic equations that would typically require the use of state machines to generate the codewords in many clock cycles.

The embodiment of ECC decoder 34 is similar although it is more complex. In this example, the ECC scheme is capable of correcting single-bit errors in the data read back from memory. TABLE B below shows codeword inputs $c_1$ to $c_7$ that represent all the possible outputs of the ECC encoder plus all possible 1-bit errors. For correction of additional bit errors, the codeword input would be expanded to include those possible error inputs. The desired outputs of the ECC decoder would be the corrected data, $d_1$ to $d_4$.

TABLE B

| Codeword input | | | | | | | Data Output | | | |
|---|---|---|---|---|---|---|---|---|---|---|
| 0 | 0 | 0 | 0 | 0 | 0 | 0 | 0 | 0 | 0 | 0 |
| 0 | 0 | 0 | 0 | 0 | 0 | 1 | 0 | 0 | 0 | 0 |
| 0 | 0 | 0 | 0 | 0 | 1 | 0 | 0 | 0 | 0 | 0 |
| 0 | 0 | 0 | 0 | 1 | 0 | 0 | 0 | 0 | 0 | 0 |
| 0 | 0 | 0 | 1 | 0 | 0 | 0 | 0 | 0 | 0 | 0 |
| 0 | 0 | 1 | 0 | 0 | 0 | 0 | 0 | 0 | 0 | 0 |
| 0 | 1 | 0 | 0 | 0 | 0 | 0 | 0 | 0 | 0 | 0 |
| 1 | 0 | 0 | 0 | 0 | 0 | 0 | 0 | 0 | 0 | 0 |
| 0 | 0 | 0 | 1 | 0 | 1 | 1 | 0 | 0 | 0 | 1 |
| 0 | 0 | 0 | 1 | 0 | 1 | 0 | 0 | 0 | 0 | 1 |
| 0 | 0 | 0 | 1 | 0 | 0 | 1 | 0 | 0 | 0 | 1 |
| 0 | 0 | 0 | 1 | 1 | 1 | 1 | 0 | 0 | 0 | 1 |
| 0 | 0 | 0 | 0 | 0 | 1 | 1 | 0 | 0 | 0 | 1 |
| 0 | 0 | 1 | 1 | 0 | 1 | 1 | 0 | 0 | 0 | 1 |
| 0 | 1 | 0 | 1 | 0 | 1 | 1 | 0 | 0 | 0 | 1 |
| 1 | 0 | 0 | 1 | 0 | 1 | 1 | 0 | 0 | 0 | 1 |
| 0 | 0 | 1 | 0 | 1 | 1 | 0 | 0 | 0 | 1 | 0 |
| 0 | 0 | 1 | 0 | 1 | 1 | 1 | 0 | 0 | 1 | 0 |
| 0 | 0 | 1 | 0 | 1 | 0 | 0 | 0 | 0 | 1 | 0 |
| 0 | 0 | 1 | 0 | 0 | 1 | 0 | 0 | 0 | 1 | 0 |
| 0 | 0 | 1 | 1 | 1 | 1 | 0 | 0 | 0 | 1 | 0 |
| 0 | 0 | 0 | 0 | 1 | 1 | 0 | 0 | 0 | 1 | 0 |
| 0 | 1 | 1 | 0 | 1 | 1 | 0 | 0 | 0 | 1 | 0 |
| 1 | 0 | 1 | 0 | 1 | 1 | 0 | 0 | 0 | 1 | 0 |
| 0 | 0 | 1 | 1 | 1 | 0 | 1 | 0 | 0 | 1 | 1 |
| 0 | 0 | 1 | 1 | 1 | 0 | 0 | 0 | 0 | 1 | 1 |
| 0 | 0 | 1 | 1 | 1 | 1 | 1 | 0 | 0 | 1 | 1 |
| 0 | 0 | 1 | 0 | 1 | 0 | 1 | 0 | 0 | 1 | 1 |
| 0 | 0 | 0 | 1 | 1 | 0 | 1 | 0 | 0 | 1 | 1 |
| 0 | 1 | 1 | 1 | 1 | 0 | 1 | 0 | 0 | 1 | 1 |
| 1 | 0 | 1 | 1 | 1 | 0 | 1 | 0 | 0 | 1 | 1 |
| 0 | 1 | 0 | 0 | 1 | 1 | 0 | 1 | 0 | 0 | 0 |
| 0 | 1 | 0 | 0 | 1 | 1 | 0 | 1 | 0 | 0 | 0 |
| 0 | 1 | 0 | 0 | 1 | 0 | 1 | 1 | 0 | 0 | 0 |
| 0 | 1 | 0 | 0 | 0 | 1 | 1 | 1 | 0 | 0 | 0 |
| 0 | 1 | 0 | 1 | 1 | 1 | 1 | 1 | 0 | 0 | 0 |
| 0 | 1 | 1 | 0 | 1 | 1 | 1 | 1 | 0 | 0 | 0 |
| 0 | 0 | 0 | 0 | 1 | 1 | 1 | 1 | 0 | 0 | 0 |
| 1 | 1 | 0 | 0 | 1 | 1 | 1 | 1 | 0 | 0 | 0 |
| 0 | 1 | 0 | 1 | 1 | 0 | 0 | 1 | 0 | 0 | 1 |
| 0 | 1 | 0 | 1 | 0 | 1 | 0 | 1 | 0 | 0 | 1 |
| 0 | 1 | 0 | 1 | 1 | 1 | 0 | 1 | 0 | 0 | 1 |
| 0 | 1 | 0 | 1 | 0 | 0 | 1 | 1 | 0 | 0 | 1 |
| 0 | 1 | 0 | 0 | 1 | 0 | 1 | 1 | 0 | 0 | 1 |
| 0 | 1 | 1 | 1 | 1 | 0 | 1 | 1 | 0 | 0 | 1 |
| 0 | 0 | 0 | 1 | 1 | 0 | 0 | 1 | 0 | 0 | 1 |
| 1 | 1 | 0 | 1 | 1 | 0 | 0 | 1 | 0 | 0 | 1 |
| 0 | 1 | 1 | 0 | 0 | 1 | 1 | 1 | 1 | 0 | 0 |
| 0 | 1 | 1 | 0 | 0 | 0 | 1 | 1 | 1 | 0 | 0 |
| 0 | 1 | 1 | 0 | 1 | 0 | 0 | 1 | 1 | 0 | 0 |
| 0 | 1 | 1 | 0 | 0 | 1 | 0 | 1 | 1 | 0 | 0 |
| 0 | 1 | 1 | 1 | 0 | 1 | 0 | 1 | 1 | 0 | 0 |
| 0 | 1 | 0 | 0 | 0 | 1 | 0 | 1 | 1 | 0 | 0 |
| 1 | 1 | 1 | 0 | 0 | 1 | 0 | 1 | 1 | 0 | 0 |
| 0 | 1 | 1 | 1 | 0 | 1 | 0 | 1 | 1 | 1 | 1 |
| 0 | 1 | 1 | 1 | 0 | 1 | 1 | 1 | 1 | 1 | 1 |
| 0 | 1 | 1 | 1 | 0 | 0 | 0 | 1 | 1 | 1 | 1 |
| 0 | 1 | 1 | 1 | 1 | 1 | 0 | 1 | 1 | 1 | 1 |
| 0 | 1 | 1 | 0 | 0 | 1 | 0 | 1 | 1 | 1 | 1 |
| 0 | 1 | 0 | 1 | 0 | 1 | 0 | 1 | 1 | 1 | 1 |
| 0 | 0 | 1 | 1 | 0 | 0 | 0 | 1 | 1 | 1 | 1 |
| 1 | 1 | 1 | 1 | 0 | 1 | 0 | 1 | 1 | 1 | 1 |
| 1 | 0 | 0 | 0 | 1 | 0 | 1 | 1 | 0 | 0 | 0 |
| 1 | 0 | 0 | 0 | 1 | 1 | 1 | 1 | 0 | 0 | 0 |
| 1 | 0 | 0 | 0 | 1 | 1 | 0 | 1 | 0 | 0 | 0 |
| 1 | 0 | 0 | 1 | 1 | 1 | 1 | 1 | 0 | 0 | 0 |
| 1 | 0 | 1 | 0 | 1 | 1 | 1 | 1 | 0 | 0 | 0 |
| 1 | 1 | 0 | 0 | 1 | 1 | 1 | 1 | 0 | 0 | 0 |
| 0 | 0 | 0 | 0 | 1 | 0 | 1 | 1 | 0 | 0 | 0 |
| 1 | 0 | 0 | 1 | 1 | 0 | 0 | 1 | 0 | 0 | 1 |
| 1 | 0 | 0 | 1 | 1 | 0 | 1 | 1 | 0 | 0 | 1 |
| 1 | 0 | 1 | 0 | 0 | 1 | 1 | 1 | 0 | 1 | 0 |
| 1 | 0 | 1 | 0 | 0 | 1 | 0 | 1 | 0 | 1 | 0 |
| 1 | 0 | 1 | 0 | 0 | 0 | 1 | 1 | 0 | 1 | 0 |
| 1 | 0 | 1 | 0 | 1 | 1 | 1 | 1 | 0 | 1 | 0 |
| 1 | 0 | 1 | 1 | 0 | 1 | 1 | 1 | 0 | 1 | 0 |
| 1 | 0 | 0 | 0 | 0 | 1 | 1 | 1 | 0 | 1 | 0 |
| 1 | 1 | 1 | 0 | 0 | 1 | 1 | 1 | 0 | 1 | 0 |
| 0 | 0 | 1 | 0 | 0 | 1 | 1 | 1 | 0 | 1 | 0 |
| 1 | 0 | 1 | 0 | 0 | 0 | 1 | 0 | 1 | 1 |   |
| 1 | 0 | 1 | 1 | 0 | 1 | 0 | 1 | 0 | 1 | 1 |
| 1 | 0 | 1 | 1 | 0 | 1 | 1 | 0 | 1 | 1 |   |
| 1 | 0 | 1 | 1 | 1 | 0 | 1 | 0 | 1 | 1 |   |
| 1 | 0 | 1 | 0 | 0 | 0 | 0 | 1 | 0 | 1 | 1 |
| 1 | 1 | 1 | 1 | 0 | 0 | 0 | 1 | 0 | 1 | 1 |
| 0 | 0 | 1 | 1 | 0 | 0 | 0 | 1 | 0 | 1 | 1 |
| 1 | 1 | 0 | 0 | 0 | 1 | 1 | 1 | 1 | 0 | 0 |
| 1 | 1 | 0 | 0 | 1 | 1 | 1 | 1 | 0 | 0 |   |
| 1 | 1 | 0 | 0 | 0 | 0 | 1 | 1 | 0 | 0 |   |
| 1 | 1 | 0 | 0 | 0 | 1 | 0 | 1 | 1 | 0 | 0 |
| 1 | 1 | 0 | 1 | 0 | 1 | 1 | 1 | 1 | 0 | 0 |
| 1 | 1 | 1 | 0 | 0 | 1 | 1 | 1 | 1 | 0 | 0 |
| 0 | 1 | 0 | 0 | 0 | 1 | 1 | 1 | 1 | 0 | 0 |
| 1 | 0 | 0 | 0 | 0 | 1 | 0 | 1 | 1 | 0 | 0 |
| 0 | 1 | 0 | 0 | 0 | 1 | 0 | 1 | 1 | 0 | 0 |
| 1 | 1 | 0 | 1 | 0 | 0 | 1 | 1 | 1 | 0 | 1 |
| 1 | 1 | 0 | 1 | 0 | 0 | 0 | 1 | 1 | 0 | 1 |
| 1 | 1 | 0 | 1 | 0 | 1 | 1 | 1 | 1 | 0 | 1 |
| 1 | 1 | 0 | 1 | 1 | 0 | 1 | 1 | 1 | 0 | 1 |
| 1 | 1 | 0 | 0 | 0 | 0 | 1 | 1 | 1 | 0 | 1 |
| 1 | 0 | 0 | 1 | 0 | 0 | 1 | 1 | 1 | 0 | 1 |
| 0 | 1 | 0 | 1 | 0 | 0 | 1 | 1 | 1 | 0 | 1 |
| 1 | 1 | 1 | 0 | 1 | 0 | 0 | 1 | 1 | 1 | 0 |
| 1 | 1 | 1 | 0 | 1 | 1 | 0 | 1 | 1 | 1 | 0 |
| 1 | 1 | 1 | 0 | 1 | 0 | 1 | 1 | 1 | 1 | 0 |
| 1 | 1 | 1 | 0 | 0 | 0 | 0 | 1 | 1 | 1 | 0 |
| 1 | 1 | 1 | 1 | 1 | 0 | 0 | 1 | 1 | 1 | 0 |
| 1 | 1 | 0 | 0 | 1 | 0 | 0 | 1 | 1 | 1 | 0 |
| 1 | 0 | 1 | 0 | 1 | 0 | 0 | 1 | 1 | 1 | 0 |
| 0 | 1 | 1 | 0 | 1 | 0 | 0 | 1 | 1 | 1 | 0 |
| 1 | 1 | 1 | 1 | 1 | 1 | 1 | 1 | 1 | 1 | 1 |
| 1 | 1 | 1 | 1 | 1 | 1 | 0 | 1 | 1 | 1 | 1 |
| 1 | 1 | 1 | 1 | 1 | 0 | 1 | 1 | 1 | 1 | 1 |
| 1 | 1 | 1 | 1 | 0 | 1 | 1 | 1 | 1 | 1 | 1 |
| 1 | 1 | 1 | 0 | 1 | 1 | 1 | 1 | 1 | 1 | 1 |
| 1 | 1 | 0 | 1 | 1 | 1 | 1 | 1 | 1 | 1 | 1 |
| 1 | 0 | 1 | 1 | 1 | 1 | 1 | 1 | 1 | 1 | 1 |
| 0 | 1 | 1 | 1 | 1 | 1 | 1 | 1 | 1 | 1 | 1 |

If the ECC decoder inputs are $c_1$, $c_2$, $c_3$, $c_4$, $c_5$, $c_6$, and $c_7$ and the outputs are $d_1$, $d_2$, $d_3$, and $d_4$, the data output can be represented by the following equations:

$d_1 = c_1$ XOR [($c_1$ XOR $c_2$ XOR $c_3$ XOR $c_5$) AND NOT($c_2$ XOR $c_3$ XOR $c_4$ XOR $c_6$) AND ($c_1$ XOR $c_2$ XOR $c_4$ XOR $c_7$)]

$d_2 = c_2$ XOR [($c_1$ XOR $c_2$ XOR $c_3$ XOR $c_5$) AND ($c_2$ XOR $c_3$ XOR $c_4$ XOR $c_6$) AND ($c_1$ XOR $c_2$ XOR $c_4$ XOR $c_7$)]

$d_3 = c_3$ [($c_1$ XOR $c_2$ XOR $c_3$ XOR $c_5$) AND ($c_2$ XOR $c_3$ XOR $c_4$ XOR $c_6$) AND NOT($c_1$ XOR $c_2$ XOR $c_4$ XOR $c_7$)]

$d_4 = c_4$ XOR [NOT($c_1$ XOR $c_2$ XOR $c_3$ XOR $c_5$) AND ($c_2$ XOR $c_3$ XOR $c_4$ XOR $c_6$) AND ($c_1$ XOR $c_2$ XOR $c_4$ XOR $c_7$)]

Figure 5:
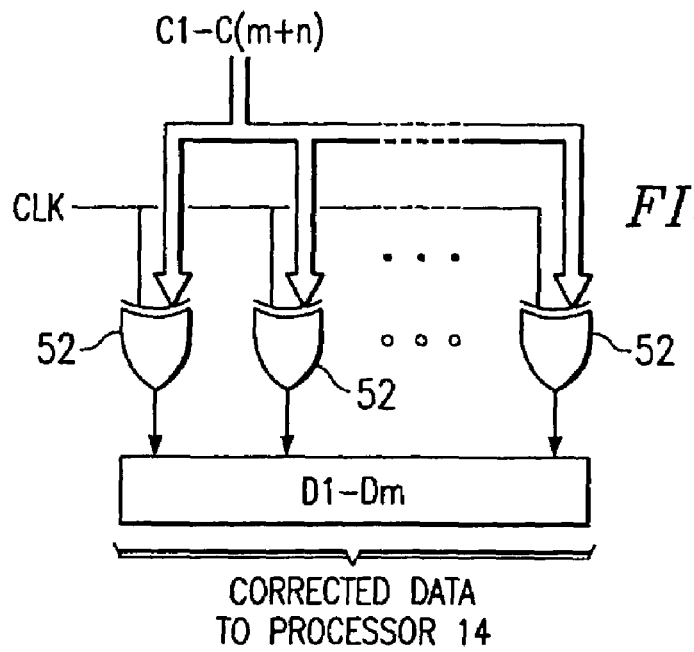
FIG. 5 is a logic diagram of an embodiment of an ECC decoder according to the teachings of the present invention.

These logic equations describe an ECC decoder that can be implemented purely by combinatorial logic that can execute in one or very few clock cycles. FIG. 5 shows a representation of the combinatorial logic circuit 52 represented by XOR gates to perform ECC decoding. Because the number of possible combination of error bits varies exponentially with the number of data bits, the above example uses a four-bit data input with three-bit ECC code, and the correction of one-bit data error. However, this example may be expanded, in a relatively straight-forward manner, to larger data blocks.

ABEL (Advanced Boolean Equation Language) is a computer language that may be used to describe the behavior of a logic circuit to generate the logic circuit implementation. ABEL is an industry-standard hardware description language (HDL) that was developed by Data I/O Corporation for programmable logic devices (PLD). There are other hardware description languages such as VHDL (Verilog Hardware Description Language), which is capable of describing systems of larger complexity. These and other hardware description languages can be used to describe the behavior of a system in a variety of forms, including logic equations, truth tables, and state diagrams using C-like statements. A compiler may then simulate and implement the logic in PLDs (programmable logic devices) such as PALs (programmable array logic), SPLDs (simple programmable logic devices), CPLDs (complex programmable logic devices) and FPGAs (field programmable gate arrays).

In operation, processor 14 communicates the data for storage in memory 16 to ECC encoder 24. ECC encoder 24 generates a codeword from predetermined-sized data blocks of the data. The resulting codeword is then written to memory 16. During a read access, the codeword read from memory 16 is decoded by the combinatorial logic in ECC decoder 34 in a single step, and the corrected data is quickly provided to processor 14.

Because developing memory technologies require a long lead time to perfect the design and fabrication processes to produce memory devices of sufficiently low defects in order to have commercial viability, techniques such as described herein that advance the yet-imperfect technologies to commercial exploitation are invaluable. Because the techniques described herein do not impede the speed of the memory device while masking the defects, such memory devices may operate as if they were without defects.

What is claimed is:

1. A memory system, comprising:
  a plurality of memory storage elements;
  an address sparing module coupled to the plurality of memory storage elements; and
  an ECC (error correcting code) combinatorial logic circuit coupled to the plurality of memory storage elements and operable to detect and correct errors in data read from the plurality of memory storage elements in less than three clock cycles.

2. The memory system, as set forth in claim 1, wherein the address sparing module is operable to map first addresses of first predetermined memory locations to second addresses of second predetermined memory locations.

3. The memory system, as set forth in claim 1, further comprising a sensing circuit coupled to the plurality of memory storage elements and operable to sense data stored in selected ones of the plurality of memory storage elements.

4. The memory system, as set forth in claim 1, further comprising a writing circuit coupled to the plurality of memory storage elements and operable to write data to selected ones of the plurality of memory storage elements.

5. The memory system, as set forth in claim 1, further comprising a secondary data storage module coupled to the ECC combinatorial logic circuit and operable to temporarily store data.

6. The memory system, as set forth in claim 1, wherein the plurality of memory storage elements comprise random access memory cells.

7. The memory system, as set forth in claim 1, wherein the plurality of memory storage elements comprise magnetoresistive random access memory cells.

8. The memory system, as set forth in claim 1, wherein the ECC combinatorial logic circuit comprises an ECC encoder operable to generate an ECC codeword based on a predetermined number of data bits.

9. The memory system, as set forth in claim 1, wherein the ECC combinatorial logic circuit comprises an ECC decoder operable to decode an ECC codeword read from the plurality of memory storage elements and correct at least one error bit in a predetermined number of data bits.

10. A device, comprising:
  a processor;
  a plurality of memory storage elements operable to store data in response to instructions from the processor;
  an address sparing module coupled to the plurality of memory storage elements and the processor, and operable to map first addresses of first predetermined memory locations received from the processor to second addresses of second predetermined memory locations; and
  an ECC (error correcting code) combinatorial logic circuit coupled to the plurality of memory storage elements and the processor, and operable to detect and correct errors in data read from the plurality of memory storage elements prior to providing the data to the processor in less than three clock cycles.

11. The device, as set forth in claim 10, further comprising a sensing circuit coupled to the plurality of memory storage elements and operable to sense data stored in selected ones of the plurality of memory storage elements.

12. The device, as set forth in claim 10, further comprising a writing circuit coupled to the plurality of memory storage elements and operable to write data to selected ones of the plurality of memory storage elements.

13. The device, as set forth in claim 10, further comprising a secondary data storage module coupled to the processor and ECC combinatorial logic circuit, and operable to temporarily store data.

14. The device, as set forth in claim 10, wherein the plurality of memory storage elements comprise random access memory cells.

15. The device, as set forth in claim 10, wherein the plurality of memory storage elements comprise magnetoresistive random access memory cells.

16. The device, as set forth in claim 10, wherein the ECC combinatorial logic circuit comprises an ECC encoder operable to generate an ECC codeword based on a predetermined number of data bits.

17. The device, as set forth in claim 10, wherein the ECC combinatorial logic circuit comprises an ECC decoder operable to decode an ECC codeword read from the plurality of memory storage elements and correct at least one error bit in a predetermined number of data bits.

18. A method, comprising:
  receiving data and at least one write address to store the data in a plurality of random access memory storage elements;
  determining whether at least known defective memory location exists;
  mapping the received write address to at least one corrected address in response to the existence of at least one known defective memory location; and generating an ECC (error correcting code) codeword using an ECC combinatorial logic encoder from the received data in less than three clock cycles and storing the ECC codeword to the plurality of random access memory storage elements.

19. The method, as set forth in claim 18, further comprising:
receiving at least one read address to read the data store therein;
mapping the received read address to the at least one corrected address in response to the existence of at least one known defective memory location; and
reading the plurality of random access memory storage elements and decoding the ECC codewords therein using an ECC combinatorial logic decoder and operable to detect and correct errors therein.

20. The method, as set forth in claim 18, further comprising sensing the ECC codeword stored in selected ones of the plurality of random access memory storage elements.

21. The method, as set forth in claim 18, further comprising writing data to selected ones of the plurality of random access memory storage elements.

22. A memory, comprising:
a plurality of memory storage elements; and
an ECC (error correcting code) combinatorial logic encoder coupled to the plurality of memory storage elements, and operable to generate an ECC codeword based on data to be stored in the plurality of memory storage elements; and
an ECC combinatorial logic decoder coupled to the plurality of memory storage elements, and operable to receive an ECC codeword read from the plurality of memory storage elements, and decode the ECC codeword to correct at least one error in the data in less than three clock cycles.

23. The memory, as set forth in claim 22, wherein the ECC combinatorial logic encoder comprises combinatorial logic operable to generate the ECC codeword in one clock cycle.

24. The memory, as set forth in claim 22, wherein the ECC combinatorial logic decoder comprises combinatorial logic operable to decode the ECC codeword and correct errors in the data in one clock cycle.

25. An ECC (error correcting code) method, comprising:
an encoding method completed in less than three clock cycles comprising:
receiving a data block of a predetermined number of bits;
generating a plurality of ECC bits based on the data block using combinatorial logic; and
appending the plurality of ECC bits to the data block and generating an ECC codeword therefrom; and
a decoding method completed in less than three clock cycles comprising:
receiving an ECC codeword; and
decoding the ECC codeword and correcting errors, if any, using combinatorial logic and generating the data block of a predetermined number of bits.

\* \* \* \* \*